(12) United States Patent
Yeh et al.

(10) Patent No.: US 10,249,585 B2
(45) Date of Patent: Apr. 2, 2019

(54) STACKABLE SEMICONDUCTOR PACKAGE AND MANUFACTURING METHOD THEREOF

(71) Applicant: Powertech Technology Inc., Hsinchu County (TW)

(72) Inventors: Yun-Hsin Yeh, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/263,391

(22) Filed: Sep. 13, 2016

(65) Prior Publication Data
US 2017/0317041 A1    Nov. 2, 2017

(30) Foreign Application Priority Data
Apr. 29, 2016   (TW) .............................. 105113516 A

(51) Int. Cl.
*H01L 21/48*   (2006.01)
*H01L 21/56*   (2006.01)
(Continued)

(52) U.S. Cl.
CPC ............ *H01L 24/06* (2013.01); *H01L 21/486* (2013.01); *H01L 21/4853* (2013.01); *H01L 21/563* (2013.01); *H01L 23/3157* (2013.01); *H01L 23/49816* (2013.01); *H01L 23/49827* (2013.01); *H01L 24/08* (2013.01); *H01L 24/11* (2013.01); *H01L 24/17* (2013.01); *H01L 24/92* (2013.01); *H01L 25/105* (2013.01); *H01L 24/13* (2013.01); *H01L 24/16* (2013.01); *H01L 24/29* (2013.01); *H01L 24/73* (2013.01); *H01L 24/81* (2013.01); *H01L 2224/02317* (2013.01); *H01L 2224/02331* (2013.01); *H01L 2224/0401* (2013.01);
(Continued)

(58) Field of Classification Search
CPC ........................................ H01L 24/08
USPC ........................................ 257/738
See application file for complete search history.

(56) References Cited

U.S. PATENT DOCUMENTS

| 8,623,753 | B1 * | 1/2014 | Yoshida | ................. | H01L 25/105 |
| | | | | | 257/686 |
| 2008/0230887 | A1 * | 9/2008 | Sun | ........................ | H01L 21/565 |
| | | | | | 257/686 |

(Continued)

*Primary Examiner* — Moazzam Hossain
*Assistant Examiner* — Omar F Mojaddedi
(74) *Attorney, Agent, or Firm* — JCIPRNET

(57) ABSTRACT

A stackable semiconductor package and manufacturing method thereof are provided. The stackable semiconductor package includes carrier, first RDL, encapsulation layer, vertical interposers, second RDL, and chip. The carrier has first surface in which the first RDL and the encapsulation layer are formed thereon. The first RDL includes first pads and second pads. The encapsulation layer covers the first RDL and has outer surface. The vertical interposers are disposed in the encapsulation layer to electrically connect with the first RDL. The second RDL is formed on the outer surface to electrically connect with the vertical interposers. The carrier includes terminal holes and chip-accommodating hole. The terminal holes correspondingly expose the second pads. The chip-accommodating hole exposes the first pads. The chip is mounted on the encapsulation layer through the chip-accommodating hole to electrically connect with the first pads.

19 Claims, 6 Drawing Sheets

(51) Int. Cl.
*H01L 23/49* (2006.01)
*H01L 25/10* (2006.01)
*H01L 23/31* (2006.01)
*H01L 23/00* (2006.01)
*H01L 23/498* (2006.01)

(52) U.S. Cl.
CPC ............ *H01L 2224/13101* (2013.01); *H01L 2224/16225* (2013.01); *H01L 2224/2919* (2013.01); *H01L 2224/32225* (2013.01); *H01L 2224/73204* (2013.01); *H01L 2224/81011* (2013.01); *H01L 2224/81815* (2013.01); *H01L 2224/92125* (2013.01); *H01L 2924/14* (2013.01); *H01L 2924/15311* (2013.01)

(56) References Cited

U.S. PATENT DOCUMENTS

| | | | |
|---|---|---|---|
| 2011/0026232 A1* | 2/2011 | Lin | H01L 21/76898 |
| | | | 361/760 |
| 2013/0182402 A1* | 7/2013 | Chen | H01L 23/49827 |
| | | | 361/807 |
| 2014/0027929 A1* | 1/2014 | Lin | H01L 23/49816 |
| | | | 257/774 |
| 2016/0276235 A1* | 9/2016 | Chen | H01L 23/481 |

* cited by examiner

STACKABLE SEMICONDUCTOR PACKAGE AND MANUFACTURING METHOD THEREOF

CROSS REFERENCE TO RELATED APPLICATION

This application claims the priority benefit of Taiwan application serial no. 105113516, filed on Apr. 29, 2016. The entirety of the above-mentioned patent application is hereby incorporated by reference herein and made a part of specification.

BACKGROUND OF THE INVENTION

1. Field of the Invention

The present invention generally relates to a field of semiconductor chip package, and more particularly, to a stackable semiconductor package and a manufacturing method thereof, which is applicable to Package-On-Package (POP) structures.

2. Description of Related Art

Currently, in the field of semiconductor packaging technology, in order to meet the demand of being multi-functional while maintaining high operation efficiency, POP structures which allow a plurality of semiconductor packages to stack with each other in a vertical direction had been developed. Two or more semiconductor packages are stacked with each other through surface adhesion after being packaged and tested individually, so as to achieve the effects of reducing surface bonding area while encompassing high density integration. Thus, the POP structures are especially suitable in integrating complex and diverse logic elements and memory devices.

In the commonly seen POP structures, a top package is directly surface-bonded to a bottom package to eliminate the usage of an interposer. In a conventionally known manufacturing method of a bottom package, a printed circuit board having a plurality of top side ball pads disposed thereon is provided. Subsequently, a plurality of first solder balls are fixed onto corresponding top side ball pads through a ball placement process while a chip is being mounted. Thereafter, a molded encapsulant is formed to cover the first solder balls and the chip. Then, a plurality of openings exposing the first solder balls are formed in the molded encapsulant through a laser drilling process. The top package is surface-bonded to the bottom package. Specifically, second solder balls of the top package are coupled to the corresponding first solder balls through a reflow process, so as to form the POP structure. However, said POP structure has limitations in the size of the interposer solder balls and in the spacings between the solder balls. For example, the reflow and fusion of the first solder balls and the second solder balls would cause variation in sizes of the interposer solder balls. Moreover, when the spacings between the solder balls are too small, short circuit due to bridge in the soldering flux between interposer solder balls would be generated, thereby causing a decrease in production yield of the POP structure.

SUMMARY OF THE INVENTION

In order to resolve the foregoing issues, the invention provides a stackable semiconductor package and a manufacturing method thereof, which may achieve advantages of miniaturization in bottom package of a POP structure, thinning in package thickness, and fine-pitch between interposer solder balls.

The invention provides a stackable semiconductor package and manufacturing method thereof, which effectively utilize a temporary carrier in a fan-out wafer/panel level packaging process. Specifically, the temporary carrier is retained in the package, so the conventional carrier de-bonding step in the fan-out wafer/panel level packaging process may be omitted and the rigidity of the package may be enhanced.

The invention provides a stackable semiconductor package. The stackable semiconductor package includes a carrier, a first redistribution layer (RDL), an encapsulation layer, a plurality of vertical interposers, a second RDL, and a chip. The carrier has a first surface. The first RDL is formed on the first surface of the carrier. The first RDL includes a plurality of first pads and a plurality of second pads. The encapsulation layer is formed on the first surface of the carrier to cover the first RDL. The encapsulation layer has an outer surface. The vertical interposers are disposed in the encapsulation layer and are electrically connected to the first RDL. The second RDL is formed on the outer surface of the encapsulation layer to electrically connect with the vertical interposers. The carrier includes a plurality of terminal holes and a chip-accommodating hole. The terminal holes correspondingly expose the second pads and the chip-accommodating hole exposes the first pads. The chip is mounted on the encapsulation layer through the chip-accommodating hole to electrically connect with the first pads. The chip does not protrude from the carrier.

The invention provides a manufacturing method of the stackable semiconductor package, which includes the following steps. A carrier having a first surface is provided. A first redistribution layer (RDL) is formed on the first surface. The first RDL includes a plurality of first pads and a plurality of second pads. An encapsulation layer is formed on the first surface of the carrier to cover the first RDL. The encapsulation layer has an outer surface. A plurality of vertical interposers are disposed in the encapsulation layer. The vertical interposers are electrically connected to the first RDL. A second RDL is formed on the outer surface of the encapsulation layer to electrically connect with the vertical interposers. The second RDL includes a plurality of third pads. A plurality of terminal holes are formed in the carrier, and the terminal holes correspondingly expose the second pads. A chip-accommodating hole is formed in the carrier, and the chip-accommodating hole exposes the first pads. A chip is mounted on the encapsulation layer through the chip-accommodating hole to electrically connect with the first pads. The chip does not protrude from the carrier.

Based on the above, the invention provides a package in which the encapsulation layer and the RDL are formed on a surface of the carrier through a Molded Interconnect System (MIS) process. Under the condition where de-carrier process is not performed, a laser drilling process is performed on another surface of the carrier to form the terminal holes and the chip-accommodating hole. The interposer solder balls are disposed in the terminal holes and the chip is mounted in the chip-accommodating hole. As such, the issue of bridge in the soldering flux between interposer solder balls may be resolved and the interference on the interposer solder balls and the ball pads (second pads) in the terminal holes during chip mounting process may be reduced. For example, the interposer solder balls and the ball pads (second pads) in the terminal holes is protected from contamination of the underfill. Therefore, stackable semiconductor package and a manufacturing method thereof of the invention may achieve advantages of miniaturization in bottom package of a POP structure, thinning in package thickness, and fine-pitch between interposer solder balls, thereby further reducing the manufacturing cost of a POP structure.

DESCRIPTION OF THE EMBODIMENTS

The accompanying drawings are included to provide further understanding, and are incorporated in and constitute a part of this specification. The accompanying drawings illustrate exemplary embodiments in a simplified schematic views and, together with the description, serve to explain the principles of the disclosure, the disclosure is not limited thereto. Specifically, the accompanying drawings demonstrate relationships among elements and have no limitation to the elements with respect to numbers, shapes, size, etc., which the drawings of the elements are not to scale, and dimensions of the elements are arbitrarily expanded or reduced for clarity. In practical applications, the number, shapes and size of the elements are determined by an actual design in demand, and a detailed layout of the actual elements may be more complex.

Figure 1:
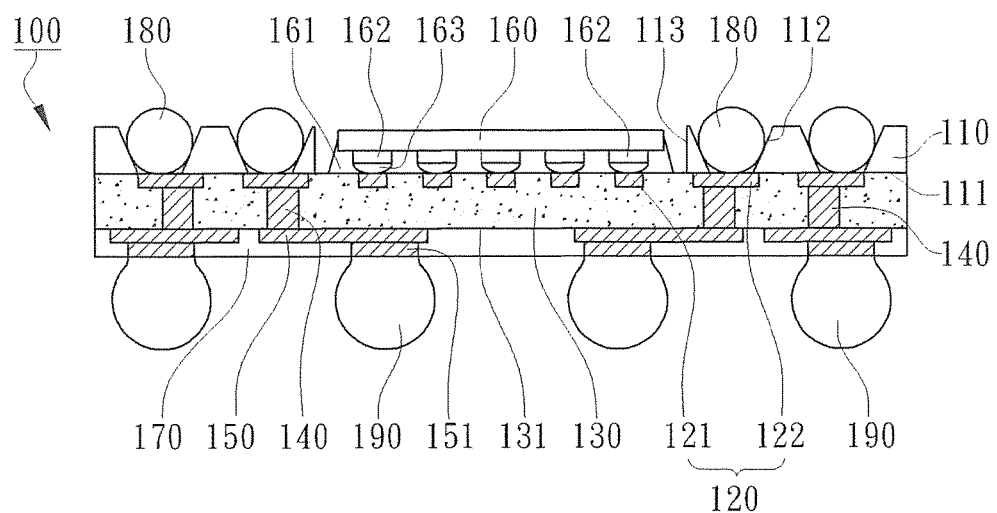
FIG. 1 is a schematic cross-sectional view illustrating a stackable semiconductor package according to an embodiment of the invention.

FIG. 1 is a schematic cross-sectional view illustrating a stackable semiconductor package 100 according to an embodiment of the invention. The stackable semiconductor package 100 includes a carrier 110, a first redistribution layer (RDL) 120, an encapsulation layer 130, a plurality of vertical interposers 140, a second RDL, and a chip 160.

Referring to FIG. 1, the carrier 110 has a first surface 111. The carrier 110 may be a rigid plate having no electrical transmission function, such as a glass plate or a semiconductor plate. The semiconductor plate is, for example, a dummy chip having no integrated circuit formed thereon while being made of semiconductor materials. The semiconductor plate is not limited to monocrystalline silicon plate. Polysilicon plate or amorphous silicon plate may also be used. A size of the carrier 110 is substantially equal to or close to a size of the package. The edges of the carrier 110 are aligned to or are slightly retracted from the edges of the stackable semiconductor package 100. Since a de-carrier step is not required, the first surface 111 may not have an adhesive layer.

The first RDL 120 is formed on the first surface 111 of the carrier 110. The first RDL 120 includes a plurality of first pads 121 and a plurality second pads 122. The first pads 121 are formed in a central region of the first surface 111 to provide electrical connection to the chip 160. The second pads 122 are formed in a peripheral region of the first surface 111 for coupling with interposer solder balls of a POP structure. The first RDL 120 may be a multi-layered structure. A method of forming a main layer of the first RDL 120 includes electro-plating. In an embodiment, a seed layer is formed on the entire carrier 110 through physical vapor deposition (PVD) or sputtering. Subsequently, a photoresist layer is formed to cover the seed layer. A photolithography process is then performed on the photoresist layer such that the patterned photoresist layer exposes circuit formation regions of the seed layer. Thereafter, an electro-plating process is performed on the seed layer located in the exposed circuit formation regions to form the first RDL 120. Since a thickness of the seed layer in a region not having circuit traces (first RDL 120) formed thereon is significantly smaller than a thickness of the circuit traces (first RDL 120), the seed layer in such region may be removed through plasma etching. Materials of the multi-layered structure of the first RDL 120 may be titanium/copper/copper. The titanium layer and the first copper layer may be utilized as the seed layer and a thickness thereof may range between 0.05 μm to 0.3 μm. The second copper layer may be adapted as the main layer and a thickness thereof may range between 2 μm to 5 μm.

The encapsulation layer 130 is formed on the first surface 111 of the carrier 110 to cover the first RDL 120. The encapsulation layer 130 has an outer surface 131. A material of the encapsulation layer 130 includes thermosetting epoxy compounds. The encapsulation layer 130 may be formed by a molding process. As shown in FIG. 1, sidewalls of the first pads 121 and sidewalls of the second pads 122 are embedded in the encapsulation layer 130.

The vertical interposers 140 are disposed in the encapsulation layer 130 to electrically connect the first RDL 120 and elements subsequently formed on the outer surface 131. The vertical interposers 140 may be a Through Molding Via (TMV) or a metal pillar plug. The TMVs include a plurality of metallic layers formed on sidewalls of through holes of the encapsulation layer 130. The metal pillar plugs are a plurality of pillars formed by electro-plating and are embedded in the through holes of the encapsulation layer 130. The vertical interposers 140 are aligned with the second pads 122.

The second RDL 150 is formed on the outer surface 131 of the encapsulation layer 130 to electrically connect with the vertical interposers 140. The second RDL 150 includes a plurality of third pads 151. A method of forming the second RDL 150 and a material of the second RDL 150 may be identical to that of the first RDL 120. A protection layer 170 may be formed on the outer surface 131 of the encapsulation layer 130 to partially cover the second RDL 150. The protection layer 170 may have a plurality of recessed areas to expose the third pads 151. As shown in FIG. 1, the sidewalls of the third pads 151 are exposed by the encapsulation layer 130.

The carrier 110 has a plurality of terminal holes 112 and a chip-accommodating hole 113. The terminal holes 112 may correspondingly expose the second pads 122. The chip-accommodating hole 113 exposes the first pads 121. A shape of the cross-section of the terminal hole 112 is preferably a conical shape having a gradually expanding opening. A size of an opening of the chip-accommodating hole 113 may be larger than an area of the first surface 111 of the encapsulation layer 130 covered by the chip 160.

The chip 160 is mounted on the encapsulation layer 130 through the chip-accommodating hole 113 to electrically connect with the first pads 121. The carrier 110 has a thickness greater than the thickness of the chip 160 to ensure the chip 160 does not protrude from the carrier 110. The chip 160 is coupled to the encapsulation layer 130 in a flip-chip manner, and an underfill 161 is formed in a gap between the chip 160 and the encapsulation layer 130. A plurality of bumps 162 may be disposed on an active surface of the chip 160. A plurality of soldering flux 163 are disposed on a surface of each bump 162 to couple the bumps 162 of the chip 160 to the first pads 121. Due to the barrier provided by the carrier 110, the terminal holes 112 are protected from contaminations of the underfill 161 and the soldering flux 163.

Referring to FIG. 1, the stackable semiconductor package 100 may further include a plurality of interposer solder balls 180 coupled to the second pads 122 through the terminal holes 112. A reflowed height of the interposer solder ball 180 is larger than a thickness of the carrier 110. The interposer solder balls 180 may slightly protrude from the carrier 110. The terminal holes 112 may be utilized as positioning holes during the ball placement process.

Referring to FIG. 1, the stackable semiconductor package 100 may also include a plurality of surface bonding solder balls 190. The surface bonding solder balls 190 are coupled to the third pads 151 and are protruding from the encapsulation layer 130. The surface bonding solder balls 190 may be used to couple to an external printed circuit board.

Figure 2:
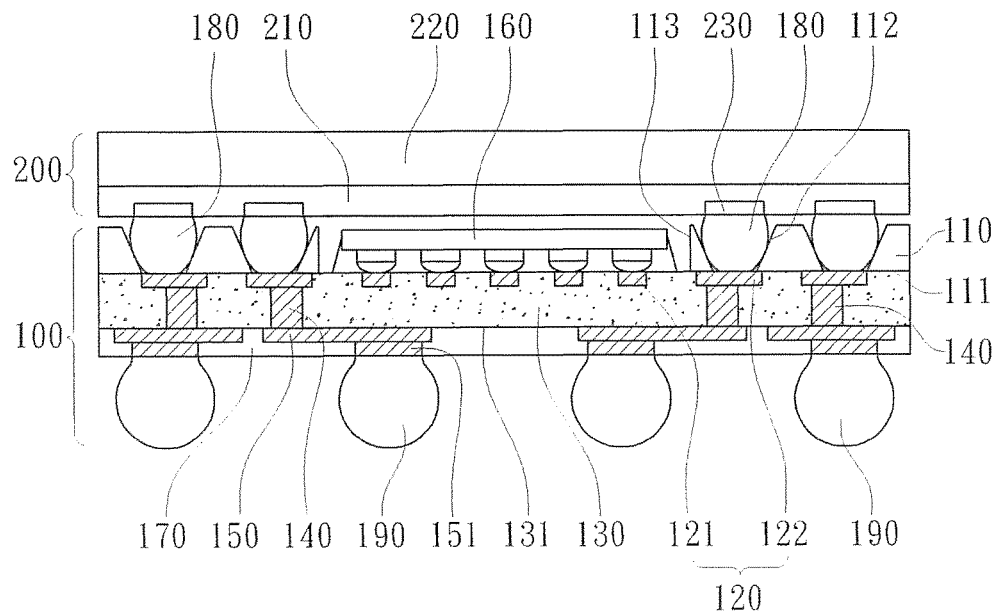
FIG. 2 is a schematic cross-sectional view illustrating an application of the stackable semiconductor package in a POP structure.

FIG. 2 is a schematic cross-sectional view illustrating an application of the stackable semiconductor package 100 in a POP structure. The stackable semiconductor package 100 may be applicable in a POP structure. A top package 200 may be stacked on and coupled to a stackable semiconductor package 100. The top package 200 includes a substrate 210 and a molded encapsulant 220 formed on a surface of the substrate 210. A plurality of external pads 230 are formed on another surface of the substrate 210. The substrate 210 may be a miniaturized printed circuit board, a miniaturized ceramic circuit board, an IC chip carrier, or a pre-molded circuit substrate/board. The interposer solder balls 180 are coupled to the external pads 230 through a reflow process.

FIG. 3A to FIG. 3L are schematic cross-sectional views illustrating main steps in a manufacturing method of a stackable semiconductor package 100. A manufacturing method of the stackable semiconductor package 100 is described in the following paragraphs.

Figure 3A:
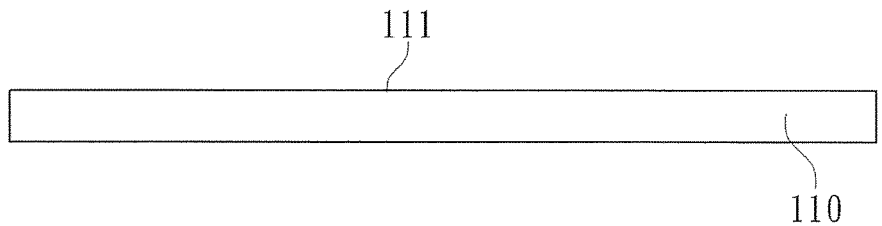
FIG. 3A to FIG. 3L are schematic cross-sectional views illustrating main steps in a manufacturing method of a stackable semiconductor package.

Referring to FIG. 3A, first, a carrier 110 is provided. The carrier 110 has a first surface 111. The carrier 110 may be a rigid plate having no electrical transmission function, such as a glass board. In this step, the carrier 110 may take the form of a wafer or a panel.

Figure 3B:
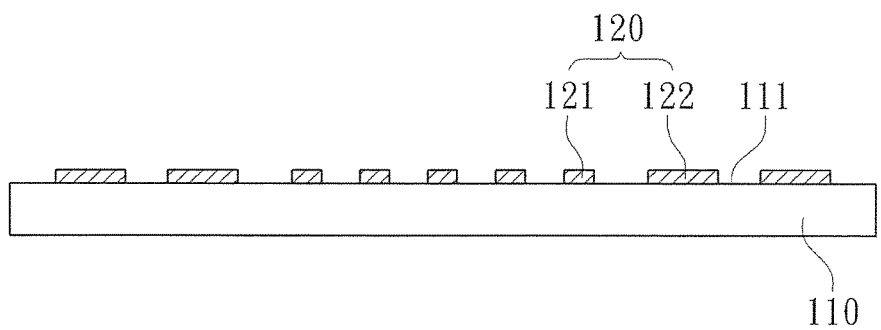

Referring to FIG. 3B, a first RDL 120 is formed on the first surface 111. The first RDL 120 includes a plurality of first pads 121 and a plurality of second pads 122. A method of forming a main layer of the first RDL 120 includes electro-plating. The first pads 121 are formed in a central region of the first surface 111 and the second pads 122 are formed in a peripheral region of the first surface 111.

Figure 3C:
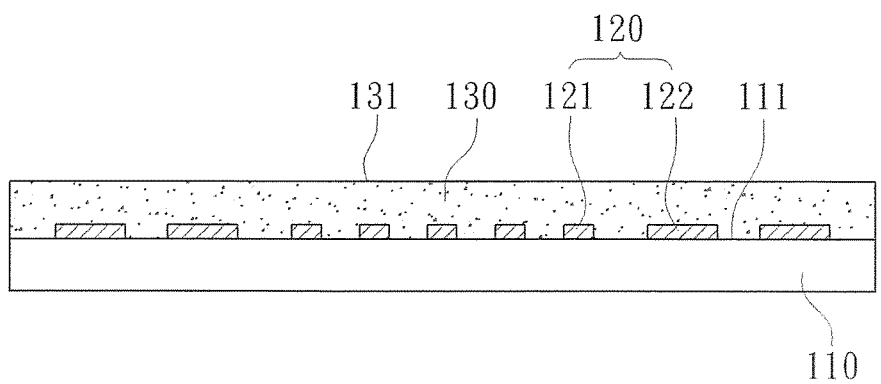

Referring to FIG. 3C, an encapsulation layer 130 is formed on the first surface 111 of the carrier 110 through a molding process to cover the first RDL 120. The encapsulation layer 130 has an outer surface 131. The foregoing molding process may include transfer molding or compression molding.

Figure 3D:
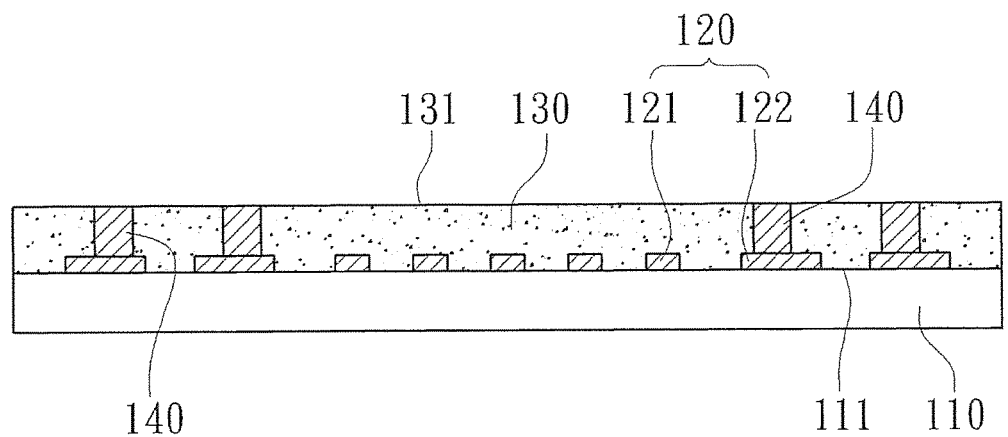

Thereafter, referring to FIG. 3D, a plurality of vertical interposers 140 are disposed in the encapsulation layer 130 to electrically connect the first RDL 120 and elements subsequently formed on the outer surface 131. A method of forming the vertical interposers 140 includes a drilling process and a hole plating process. The drilling process includes forming through holes in the encapsulation layer 130. The hole plating process includes forming conductive layers or conductive pillars in the through holes. The vertical interposers 140 may include metallic layers within holes or metallic conductive pillars. A material of the vertical interposers 140 may include copper.

Figure 3E:
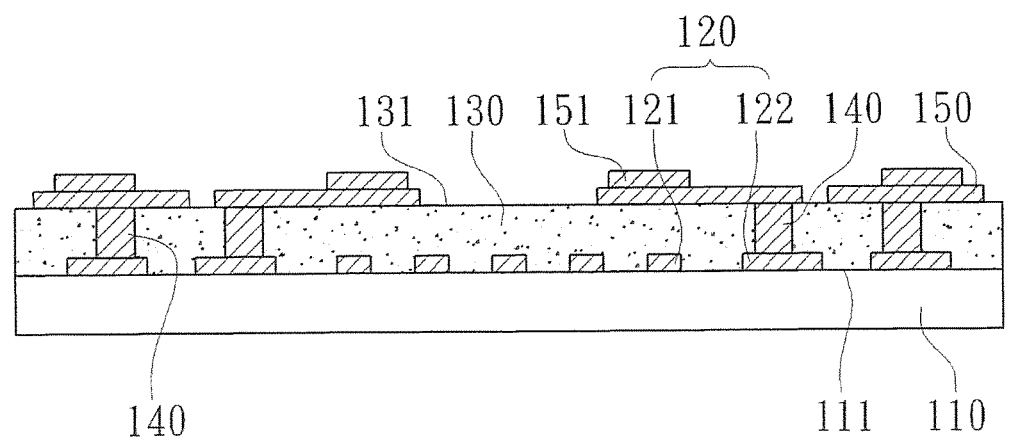

Referring to FIG. 3E, a second RDL 150 is formed on the outer surface 131 of the encapsulation layer 130 to electrically connect with the vertical interposers 140. The second RDL 150 includes a plurality of third pads 151. The vertical interposers 140 are partially exposed by regions of the outer surface 131, and the second RDL 150 covers the said regions. The third pads 151 protrude from the outer surface 131.

Figure 3F:
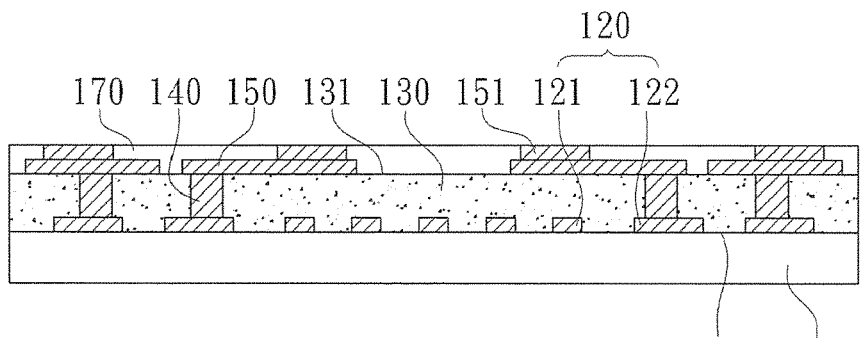

Referring to FIG. 3F, a protection layer 170 is formed on the outer surface 131 of the encapsulation layer 130 to partially cover the second RDL 150. However, the protection layer 170 has a plurality of recessed areas exposing the third pads 151. A material of the protection layer 170 may include Polyimide (PI). A method of forming the protection layer 170 includes chemical vapor deposition (CVD) or printing.

Figure 3G:
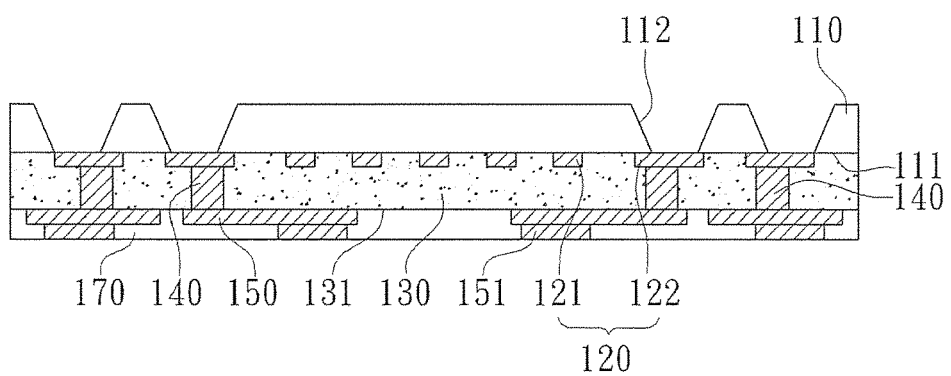

Referring to FIG. 3G, after rotating the encapsulation layer 130 and the carrier 110 by 180°, a plurality of terminal holes 112 are formed in the carrier 110 by performing a laser drilling process on the carrier 110. The terminal holes 112 may correspondingly expose the second pads 122.

Figure 3H:
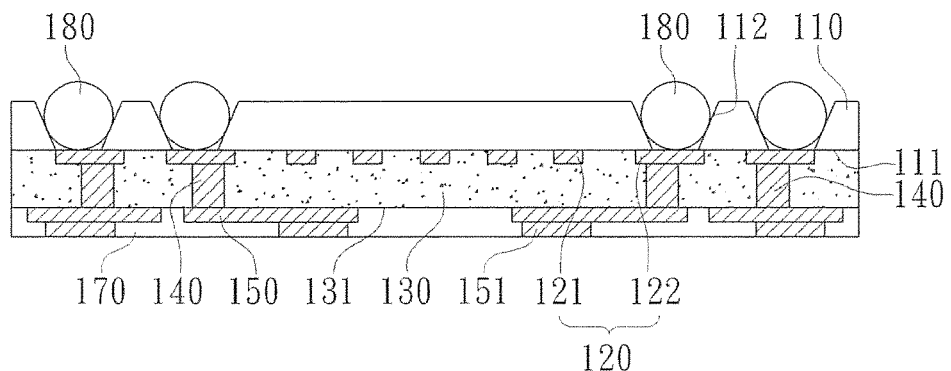

Afterwards, referring to FIG. 3H, a plurality of interposer solder balls 180 are coupled to the second pads 122 through the terminal holes 112. A reflowed height of the interposer solder ball 180 is larger than a thickness of the carrier 110. The interposer solder balls may 180 slightly protrude from the carrier 110. A material of the interposer solder balls 180 may be tin-lead alloy or lead-free solder. A method of forming the interposer solder balls 180 may include a ball placement process and a reflow process, and may also include a soldering flux printing process and the reflow process.

Figure 3I:
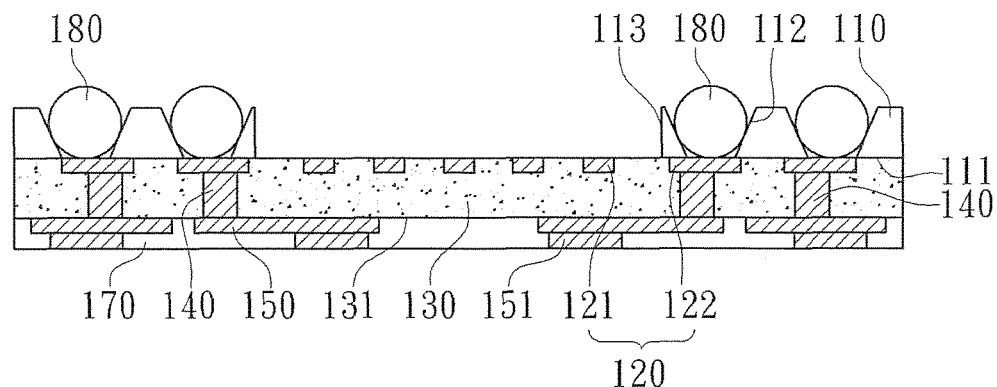

Referring to FIG. 3I, a chip-accommodating hole 113 is formed in the carrier 110. The chip-accommodating hole 113 exposes the first pads 121. An opening of the chip-accommodating hole 113 may be rectangular shape which corresponds to a shape of the chip. A size of the chip-accommodating hole 113 may be larger than a size of the chip. A method of forming the chip-accommodating hole 113 may include laser drilling or etching.

Figure 3J:
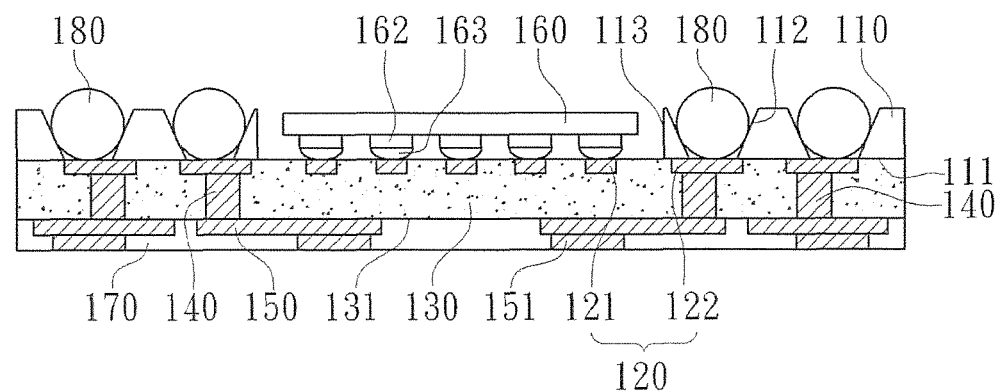
Figure 3K:
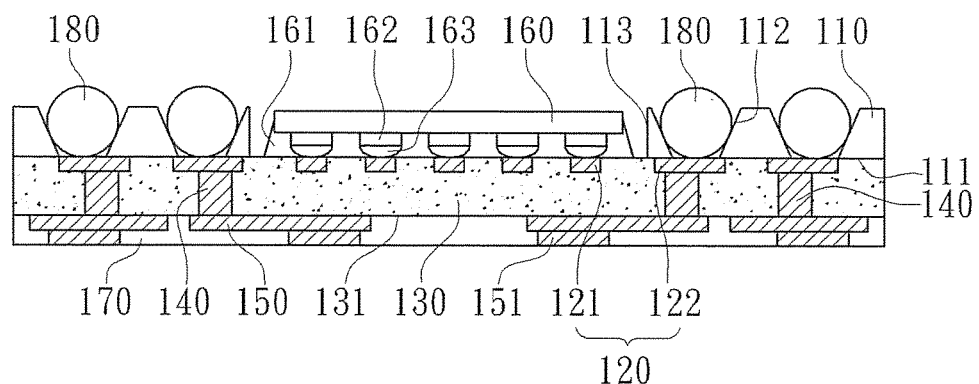

Thereafter, referring to FIG. 3J, a chip 160 is mounted on the encapsulation layer 130 through the chip-accommodating hole 113 to electrically connect with the first pads 121. As mentioned above, the carrier 110 has a thickness greater than the thickness of the chip 160, so the chip 160 does not protrude from the carrier 110. The chip 160 is coupled to the encapsulation layer 130 in a flip-chip manner. A plurality of bumps 162 may be disposed on an active surface of the chip 160. A plurality of soldering flux 163 are correspondingly disposed on a surface of the each bump 162 for coupling with the first pads 121. Subsequently, referring to FIG. 3K, an underfill 161 is formed in a gap between the chip 160 and the encapsulation layer 130 to encase the bumps 162 and the soldering flux 163 underneath the chip 160.

Figure 3L:
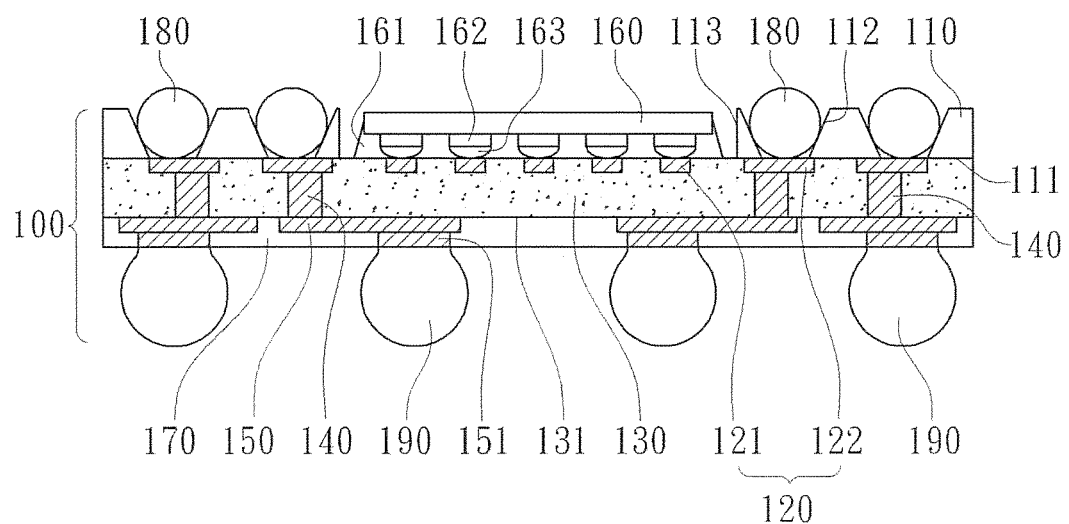

Referring to FIG. 3L, a plurality of surface bonding solder balls 190 are coupled to the third pads 151 and are protruding from the encapsulation layer 130. The surface bonding solder balls 190 may be used to couple to an external printed circuit board. Herein, the stackable semiconductor package 100 mentioned above is formed.

Referring to FIG. 3L, a top package 200 may be stacked on the stackable semiconductor package 100. The top package 200 includes a substrate 210 and a molded encapsulant 220 formed on a surface of the substrate 210. A plurality of external pads 230 are formed on an outer surface of the substrate 210. The substrate 210 may be a miniaturized printed circuit board, a miniaturized ceramic circuit board, an IC chip carrier, or a pre-molded circuit substrate/board. The top package 200 may be disposed on the stackable semiconductor package 100 in an aligned manner. The interposer solder balls 180 are coupled to the external pads 230 through reflow, so as to obtain the POP structure illustrated in FIG. 2.

Based on the above, the invention provides a stackable semiconductor package and a manufacturing method thereof, which may achieve advantages of miniaturization in bottom package of a POP structure, thinning in package thickness, and fine-pitch between interposer solder balls, thereby further reducing the manufacturing cost of a POP structure.

The above disclosure includes the exemplary examples of the invention, however, the scope of the invention is not limited thereto. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stackable semiconductor package, comprising:
   a carrier having a first surface, at least one sidewall substantially perpendicular to the first surface, and a plurality of through holes penetrating through the first surface, the through holes including a plurality of terminal holes and a chip-accommodating hole, wherein the carrier is only made of a rigid plate having no electrical transmission function;
   a first redistribution layer (RDL) formed directly on and in physical contact with the first surface of the carrier, wherein the first RDL comprises a plurality of first pads and a plurality of second pads, the terminal holes correspondingly expose a portion of each of the second pads, and the chip-accommodating hole exposes the first pads;
   an encapsulation layer formed directly on and in physical contact with the first surface of the carrier, the encapsulation layer encapsulating the first RDL, wherein the encapsulation layer has an outer surface and at least one sidewall substantially perpendicular to the outer surface of the encapsulation layer and the first surface of the carrier, the at least one sidewall of the encapsulation layer being correspondingly coplanar to the at least one sidewall of the carrier;
   a plurality of vertical interposers disposed in the encapsulation layer, wherein the vertical interposers are electrically connected to the first RDL;
   a second RDL formed on the outer surface of the encapsulation layer to electrically connect with the vertical interposers, the second RDL comprising a plurality of third pads; and
   a chip disposed in the chip-accommodating hole, and electrically connected to the first pads.

2. The stackable semiconductor package according to claim 1, further comprising a plurality of interposer solder balls, wherein the interposer solder balls are coupled to the second pads through the terminal holes, and a reflowed height of the interposer solder balls is larger than a thickness of the carrier such that the interposer solder balls protrude from the carrier.

3. The stackable semiconductor package according to claim 1, wherein the chip does not protrude from the carrier and is coupled to the encapsulation layer in a flip-chip manner, and an underfill is formed in a gap between the chip and the encapsulation layer.

4. The stackable semiconductor package according to claim 1, further comprising a plurality of surface bonding solder balls, wherein the surface bonding solder balls are coupled to the third pads and are protruding from the encapsulation layer.

5. The stackable semiconductor package according to claim 4, further comprising a protection layer formed on the outer surface of the encapsulation layer, so as to partially cover the second RDL and not cover the third pads.

6. The stackable semiconductor package according to claim 1, wherein the first RDL is a multi-layered structure.

7. The stackable semiconductor package according to claim 1, wherein the vertical interposers comprise a Through Molding Via (TMV) or a metal pillar plug.

8. The stackable semiconductor package according to claim 1, further comprising:
   a plurality of bumps disposed between the chip and the first pads; and
   a plurality of soldering flux disposed between the bumps and the first pads to electrically connect the chip and the first pads.

9. The stackable semiconductor package according to claim 8, wherein the terminal holes are separated from the soldering flux by the carrier.

10. The stackable semiconductor package according to claim 1, wherein the first surface does not have an adhesive layer disposed thereon.

11. The stackable semiconductor package according to claim 1, wherein the chip is completely located in the chip-accommodating hole.

12. A manufacturing method of a stackable semiconductor package, comprising:
   providing a carrier having a first surface and at least one sidewall substantially perpendicular to the first surface, wherein the carrier is only made of a rigid plate having no electrical transmission function;
   forming a first redistribution layer (RDL) directly on and in physical contact with the first surface of the carrier, wherein the first RDL comprises a plurality of first pads and a plurality of second pads;
   forming an encapsulation layer directly on and in physical contact with the first surface of the carrier, the encapsulation layer encapsulating the first RDL, wherein the encapsulation layer has an outer surface and at least one sidewall substantially perpendicular to the outer surface of the encapsulation layer and the first surface of the cather, the at least one sidewall of the encapsulation layer being correspondingly coplanar to the at least one sidewall of the carrier;
   disposing a plurality of vertical interposers in the encapsulation layer, wherein the vertical interposers are electrically connected to the first RDL;
   forming a second RDL on the outer surface of the encapsulation layer to electrically connect with the vertical interposers, wherein the second RDL comprises a plurality of third pads;
   forming a plurality of through holes penetrating through the first surface of the carrier after the second RDL is formed, wherein the through holes include a plurality of terminal holes and a chip-accommodating hole, and forming the plurality of through holes comprises
       forming the plurality of terminal holes in the carrier, wherein the terminal holes correspondingly expose a portion of each of the second pads; and forming the chip-accommodating hole in the carrier, wherein the chip-accommodating hole exposes the first pads; and disposing a chip in the chip-accommodating hole, and electrically connecting the chip to the first pads.

13. The manufacturing method of the stackable semiconductor package according to claim 12, further comprising:

after the step of forming the terminal holes in the carrier and before the step of forming the chip-accommodating hole in the carrier, coupling a plurality of interposer solder balls to the second pads through the terminal holes, wherein a reflowed height of the interposer solder balls is larger than a thickness of the carrier such that the interposer solder balls protrude from the carrier.

14. The manufacturing method of the stackable semiconductor package according to claim 13, where the interposer solder balls are formed by a soldering flux printing process, a ball placement process, and a reflow process.

15. The manufacturing method of the stackable semiconductor package according to claim 12, wherein the chip does not protrude from the carrier and is coupled to the encapsulation layer in a flip-chip manner, and an underfill is formed in a gap between the chip and the encapsulation layer.

16. The manufacturing method of the stackable semiconductor package according to claim 12, further comprising:

after the step of forming the second RDL on the outer surface and before the step of forming the terminal holes in the carrier, forming a protection layer on the outer surface of the encapsulation layer, so as to partially cover the second RDL and not cover the third pads.

17. The manufacturing method of the stackable semiconductor package according to claim 12, wherein the step of forming the first RDL comprises:

forming a seed layer over the carrier;

forming a patterned photoresist layer exposing at least part of the seed layer;

performing an electro-plating process on the part of the seed layer being exposed; and removing the seed layer covered by the patterned photoresist layer, so as to form the first RDL.

18. A Package-On-Package (POP) structure, comprising:

a stackable semiconductor package according to claim 1; and a top package, comprising:

a substrate;

a molded encapsulant disposed on a surface of the substrate; and a plurality of external pads disposed on another surface of the substrate, wherein the external pads are coupled to interposer solder balls comprised in the stackable semiconductor package.

19. The POP structure according to claim 18, wherein the substrate comprises a miniaturized printed circuit board, a miniaturized ceramic circuit board, an IC chip carrier, or a pre-molded circuit substrate/board.

\* \* \* \* \*